(12) United States Patent
Wang et al.

(10) Patent No.: US 12,303,030 B1
(45) Date of Patent: May 20, 2025

(54) DRAWER ASSEMBLY

(71) Applicant: Schneider Electric (China) Co., Ltd., Beijing (CN)

(72) Inventors: Zhibao Wang, Beijing (CN); Baoyun Bi, Beijing (CN); Qinghong Zhang, Beijing (CN); Kun Liu, Beijing (CN)

(73) Assignee: Schneider Electric (China) Co., Ltd., Beijing (CN)

( * ) Notice: Subject to any disclaimer, the term of this patent is extended or adjusted under 35 U.S.C. 154(b) by 40 days.

(21) Appl. No.: 18/390,752

(22) Filed: Dec. 20, 2023

(30) Foreign Application Priority Data

Nov. 17, 2023 (CN) .......................... 202323116347.6

(51) Int. Cl.
*A45C 13/22* (2006.01)
*A47B 95/02* (2006.01)

(52) U.S. Cl.
CPC ........ *A47B 95/02* (2013.01); *A47B 2095/024* (2013.01)

(58) Field of Classification Search
CPC . A47B 95/02; A47B 95/023; A47B 2095/023; A47B 2095/024; A47B 2095/026; E05B 1/00; E05B 1/0015; E05B 1/0053; E05B 85/10; E05B 79/06; F25D 23/02; F25D 23/028; F25D 2400/06; F16B 33/00; F16B 37/16

See application file for complete search history.

(56) References Cited

U.S. PATENT DOCUMENTS 3,156,944 A * 11/1964 Bohn .................... E05B 1/0015
                                                              16/412
3,311,943 A *  4/1967 Budai .................... A47B 95/02
                                                              16/419

(Continued)

FOREIGN PATENT DOCUMENTS

CN           110730578 A      1/2020

OTHER PUBLICATIONS

Extended European Search Report dated Jul. 10, 2024 for corresponding European Patent Application No. 23218808.6-1201, 28 pages.

*Primary Examiner* — Chuck Y Mah
(74) *Attorney, Agent, or Firm* — Troutman Pepper Locke LLP

(57) ABSTRACT

Embodiments of the present disclosure provides a drawer assembly, the drawer assembly includes a drawer. The drawer includes a housing and a connecting part and a limiting groove disposed on an outer wall of the housing, the size of an end of the connecting part away from the housing being greater than the size of an end of the connecting part adjacent to the housing; and a handle detachably connected to the drawer, the handle includes a fixed gripping portion and a limiting portion, a connecting groove being disposed at an end of the fixed gripping portion adjacent to the housing, a snap-on part being disposed within the connecting groove, the limiting portion passing through the fixed gripping portion and being movable towards or away from the housing, wherein in a case that an end of the limiting portion adjacent to the housing moves to the inside of the limiting groove, an end of the connecting part adjacent to the housing is fitted with the card connecting part, so that the connecting part is limited within the connecting groove.

8 Claims, 9 Drawing Sheets

(56) References Cited

U.S. PATENT DOCUMENTS

| | | | |
|---|---|---|---|
| 3,484,894 A | 12/1969 | Fletcher | |
| 5,005,255 A * | 4/1991 | Pare | E05B 1/0015 16/429 |
| 5,485,654 A * | 1/1996 | Nespodzany, Jr. | B64G 1/645 16/422 |
| 5,727,858 A * | 3/1998 | Shapiro | A47B 95/02 16/416 |
| 7,870,647 B2 * | 1/2011 | Steurer | E05B 1/0015 248/220.21 |
| 8,523,126 B2 * | 9/2013 | Garrels | A47K 17/022 29/525.01 |
| 8,813,995 B2 * | 8/2014 | Kim | F25D 23/028 312/405 |
| 9,297,182 B2 * | 3/2016 | Moody | E05B 1/0015 |
| 11,867,854 B2 * | 1/2024 | Kim | G01T 7/00 |
| 2011/0179603 A1 * | 7/2011 | Edelen | A47B 95/02 16/415 |
| 2012/0170215 A1 | 7/2012 | Fan et al. | |
| 2014/0230332 A1 * | 8/2014 | Martinez Garcia | A47B 95/02 49/353 |
| 2021/0093085 A1 * | 4/2021 | Pifer | A47B 95/02 |

\* cited by examiner

DRAWER ASSEMBLY

CROSS-REFERENCE

The present application claims priority to Chinese Patent Application No. 2023231163476, filed on Nov. 17, 2023, and entitled "DRAWER ASSEMBLY", the entirety of which is incorporated herein by reference.

FIELD

Embodiments of the present disclosure generally relate to the technical field of mechanical structures, and more particularly, to a drawer assembly.

BACKGROUND

A plurality of drawers are generally arranged side by side, and handles are fixed on each drawer. Considering the demand for low cost, the volume of the drawer needs to be very small, and thus, the handle is further made small, which makes it difficult for operators to apply force when pushing the drawer in and pulling it out.

SUMMARY

An objective of the present disclosure is to provide a drawer assembly to at least partly solve the above problems.

In an aspect of the present disclosure, there is provided a drawer assembly, the drawer assembly comprises a drawer, comprising a housing and a connecting part and a limiting groove disposed on an outer wall of the housing, the size of an end of the connecting part away from the housing being greater than the size of an end of the connecting part adjacent to the housing; and a handle, detachably connected to the drawer, the handle comprising a fixed gripping portion and a limiting portion, a connecting groove being disposed at an end of the fixed gripping portion adjacent to the housing, a snap-on part being disposed within the connecting groove, the limiting portion passing through the fixed gripping portion and being movable towards or away from the housing, wherein in a case that an end of the limiting portion adjacent to the housing moves to the inside of the limiting groove, an end of the connecting part adjacent to the housing is fitted with the snap-on part, so that the connecting part is limited within the connecting groove.

According to embodiments of the present disclosure, one end of the limiting portion adjacent to the housing moves to the inside of the limiting groove, so that the handle is limited by the drawer along the radial direction of the limiting groove; in addition, one end of the connecting part adjacent to the housing is fitted with the snap-on part, and the connecting part is limited in the connecting groove, so that the handle is limited by the drawer along the axial direction of the limiting groove. Therefore, the handle is firmly mounted to the drawer, and the handle is detachably connected with the drawer, which can increase the volume of the handle according to the usage requirements and thus facilitates the operator to apply force.

In some embodiments, the limiting portion comprises a limiting rod passing through the fixed gripping portion and a limiting part and a base disposed at both ends of the limiting rod, the limiting part is adjacent to the housing and fitted with the limiting groove.

In some embodiments, the limiting portion further comprises a first elastic part disposed around an outer surface of the limiting rod, a receiving groove is disposed at an end of the fixed gripping portion adjacent to the housing, one end of the first elastic part is in contact with an end face of the receiving groove away from the housing, the other end of the first elastic part is in contact with the limiting part, and in a case that the first elastic part is released, the limiting part extends from the receiving groove.

In some embodiments, the handle further comprises a movable gripping portion wrapped by the fixed gripping portion, the movable gripping portion is movable towards or away from the housing, a locking part is further disposed inside the drawer, the locking part passing through the housing and an end of the locking part passing through the housing is connected to the movable gripping portion, wherein in a case that the movable gripping portion moves away from the housing, the movable gripping portion drives the locking part to move and unlocks the locking part.

In some embodiments, an end of the movable gripping portion away from the housing is spaced apart from an end of the fixed gripping portion away from the housing, and a second elastic part is disposed at an end of the movable gripping portion away from the housing, and the other end of the second elastic part is connected to an end of the fixed gripping portion away from the housing.

In some embodiments, a moving groove is further disposed at an end of the fixed gripping portion adjacent to the housing, and an end of the locking part passing through the housing is movable within the moving groove to be connected to the movable gripping portion.

In some embodiments, the drawer further comprises a mounting part disposed on an inner wall of the housing, the locking part is disposed on an outer surface of the mounting part and movable along the mounting part.

In some embodiments, a third elastic part disposed on an outer surface of the mounting part, an end of the third elastic part contacting the inner wall of the housing, and the other end of the third elastic part is in contact with the locking part.

In some embodiments, it should be understood that the contents described in this section are not intended to limit critical or important features of the embodiments of the present disclosure, nor are they intended to limit the scope of the present disclosure. Other features of the present disclosure will become easier to be understood from the following description.

It should be understood that the contents described in this section are not intended to limit critical or important features of the embodiments of the present disclosure, nor are they intended to limit the scope of the present disclosure. Other features of the present disclosure will become easier to be understood from the following description.

BRIEF DESCRIPTION OF THE DRAWINGS

The above and other features, advantages and aspects of various embodiments of the present disclosure will become more apparent in conjunction with the accompanying drawings and with reference to the following detailed description. In the drawings, like or similar reference numerals denote like or similar elements, wherein.

Figure 1:
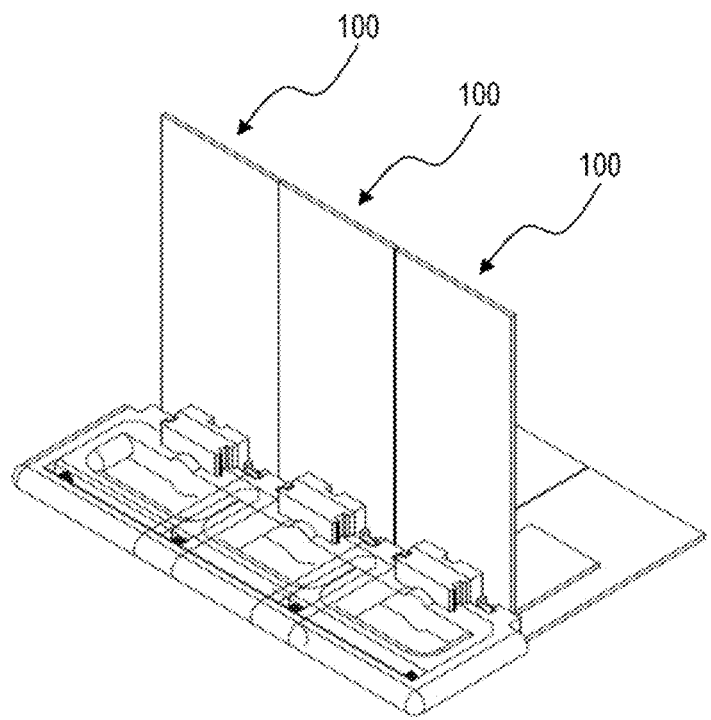
FIG. 1 shows a schematic view of the arrangement of a drawer assembly according to some embodiments of the present disclosure.

DESCRIPTION OF REFERENCE SIGNS 100 denotes a drawer assembly;
1 denotes a drawer, 11 denotes a housing, 111 denotes a connecting part, 112 denotes a limiting groove, 113 denotes a mounting part, 114 denotes a third elastic part, and 12 denotes a locking part.
2 denotes a handle, 21 denotes a fixed gripping portion, 211 denotes a connecting groove, 212 denotes a receiving groove, 213 denotes a moving groove, 22 denotes a limiting portion, 221 denotes a limiting rod, 222 denotes a limiting part, 223 denotes a base, 224 denotes a first elastic part; 23 denotes a movable gripping portion, 231 denotes a second elastic part, 24 denotes a snap-on part.

DETAILED DESCRIPTION

Preferred embodiments of the present disclosure will be described in more detail below with reference to the accompanying drawings. Although the preferred embodiments of the present disclosure are shown in the drawings, it should be understood that the present disclosure can be implemented in various forms and should not be limited by the embodiments set forth herein. Instead, these embodiments are provided to make the present disclosure more thorough and complete, and to fully convey the scope of the present disclosure to those skilled in the art.

The term "including" and its variations used in this article indicate open inclusion, that is, "including but not limited to". Unless otherwise stated, the term "or" means "and/or". The term "based on" means "at least partially based on". The terms "one example embodiment" and "one embodiment" mean "at least one example embodiment". The term "another embodiment" means "at least one additional embodiment". The terms "first", "second", etc. can refer to different or identical objects.

As described above, a plurality of drawers are generally arranged side by side, and handles are fixed on each drawer. Considering the demand for low cost, the volume of the drawer needs to be made very small, and thus the handle is further very small, which makes it difficult for operators to apply force when pushing and pulling the drawer. Embodiments of the present disclosure provide a drawer assembly 100 to at least partly solve the above problems. Hereinafter, the principles of the present disclosure will be described in conjunction with FIGS. 1 to 10.

Figure 2:
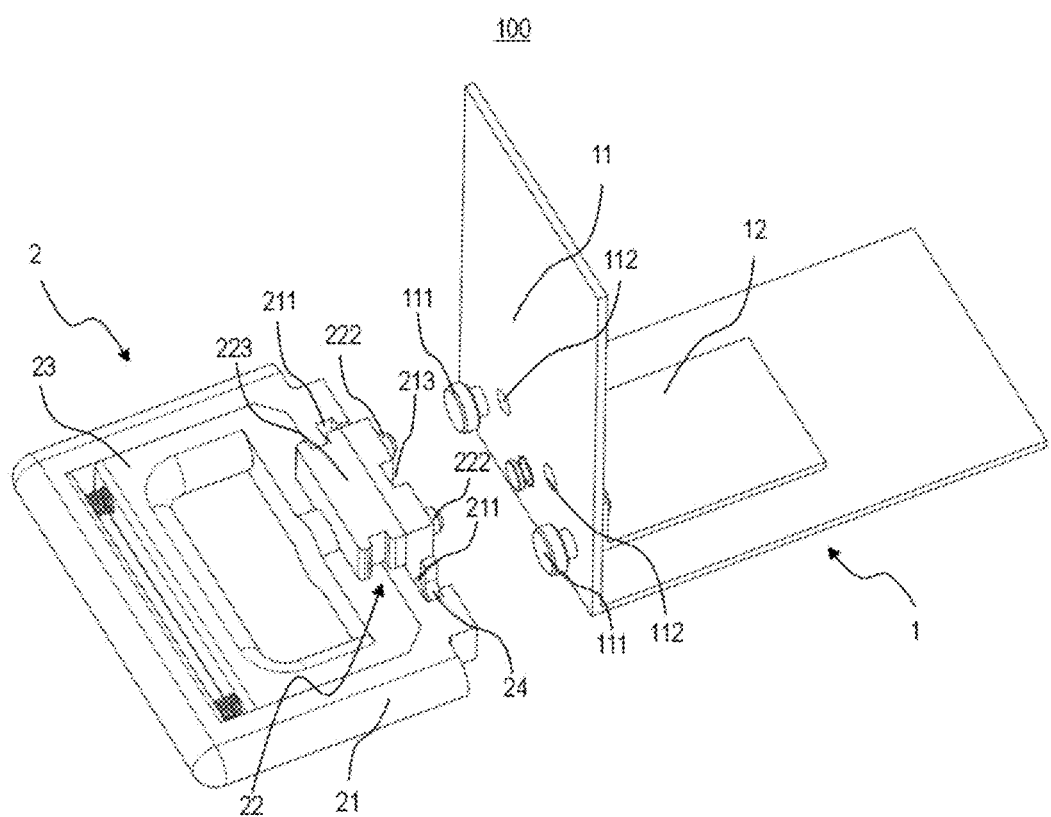
FIGS. 2 to 4 show a schematic view of the mounting of drawers and a handle according to some embodiments of the present disclosure.
Figure 3:
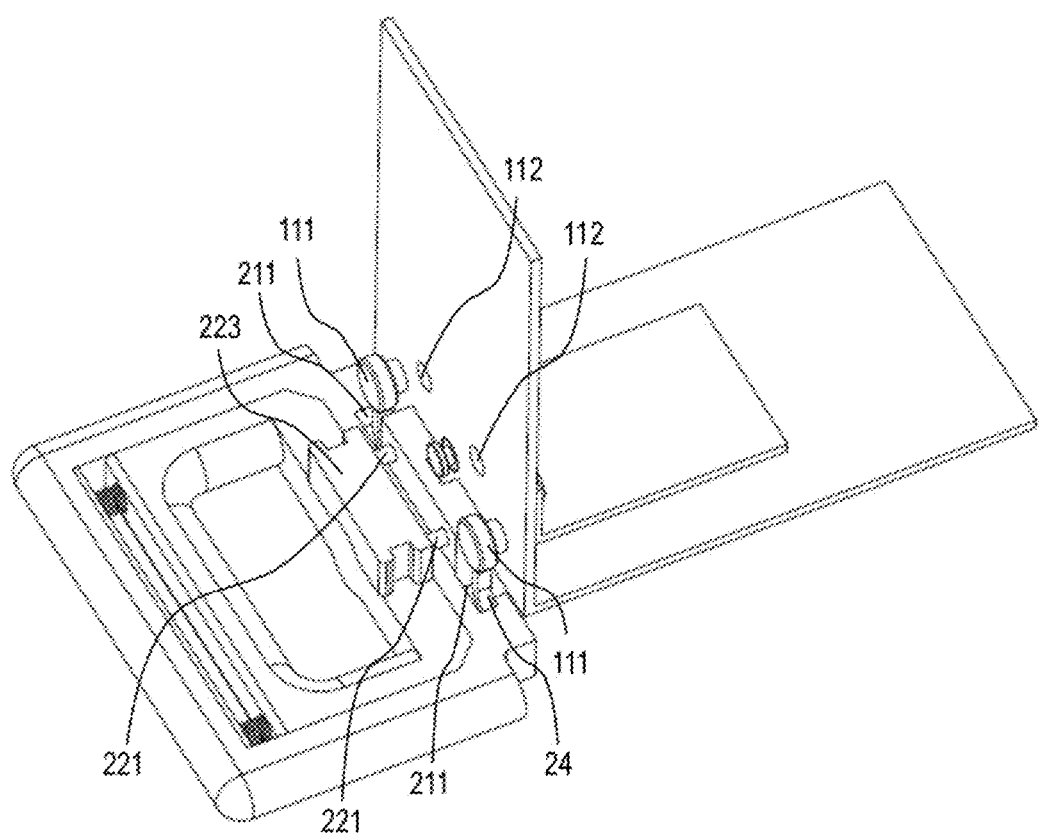
Figure 4:
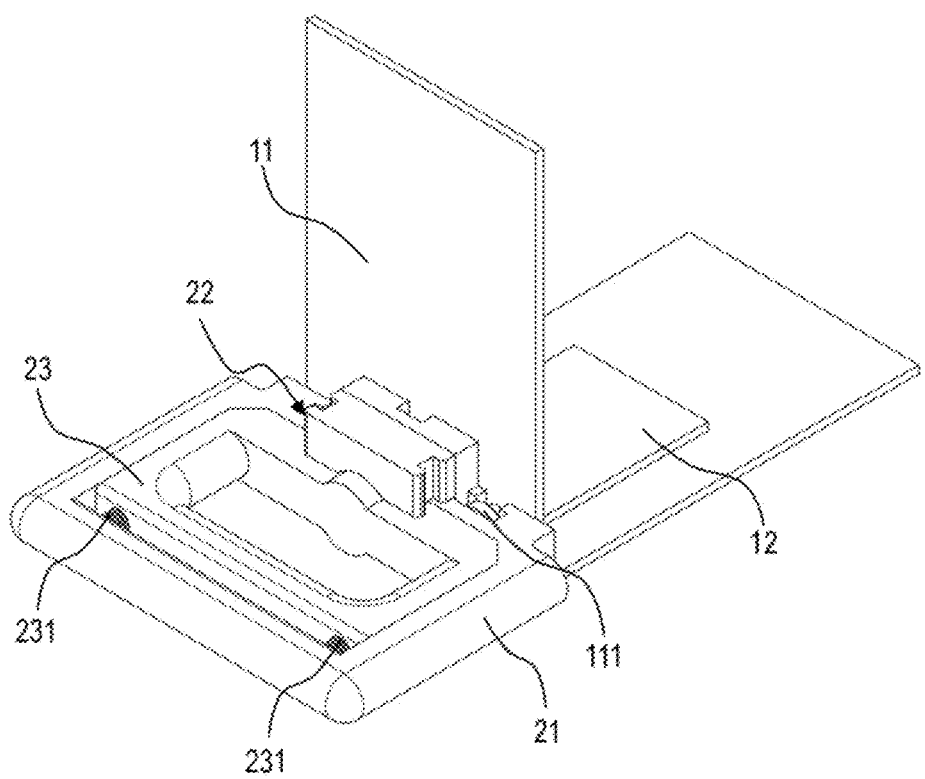
Figure 5:
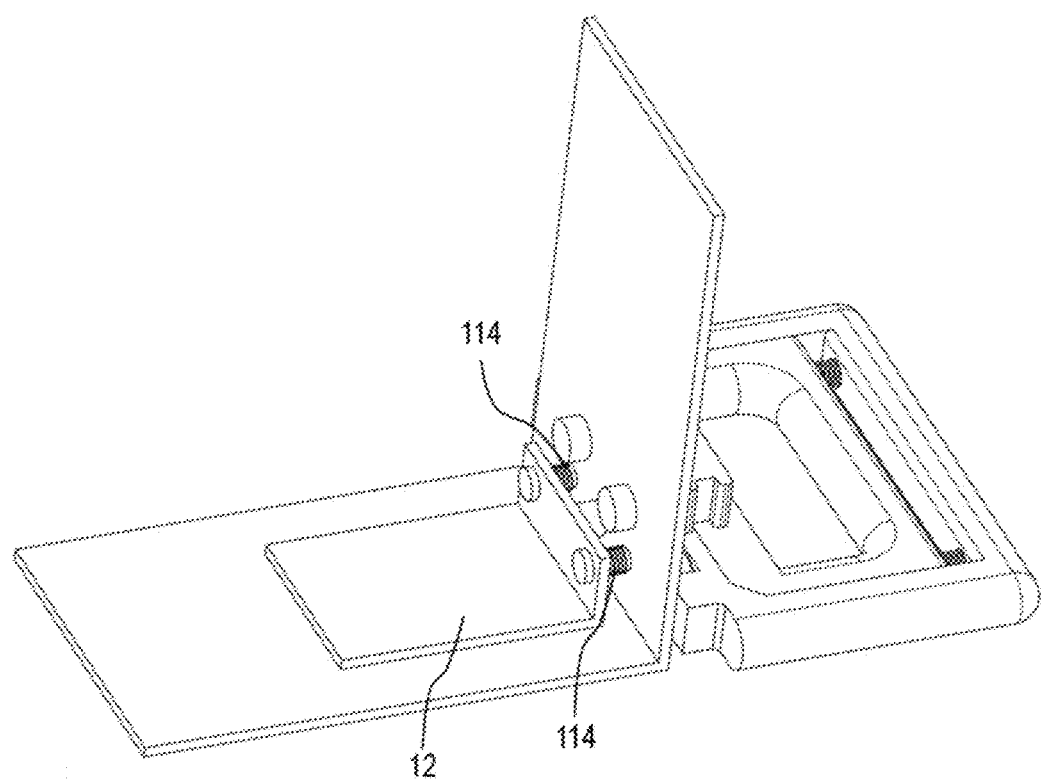
FIGS. 5 to 6 show a schematic view of unlocking the drawer according to some embodiments of the present disclosure.
Figure 6:
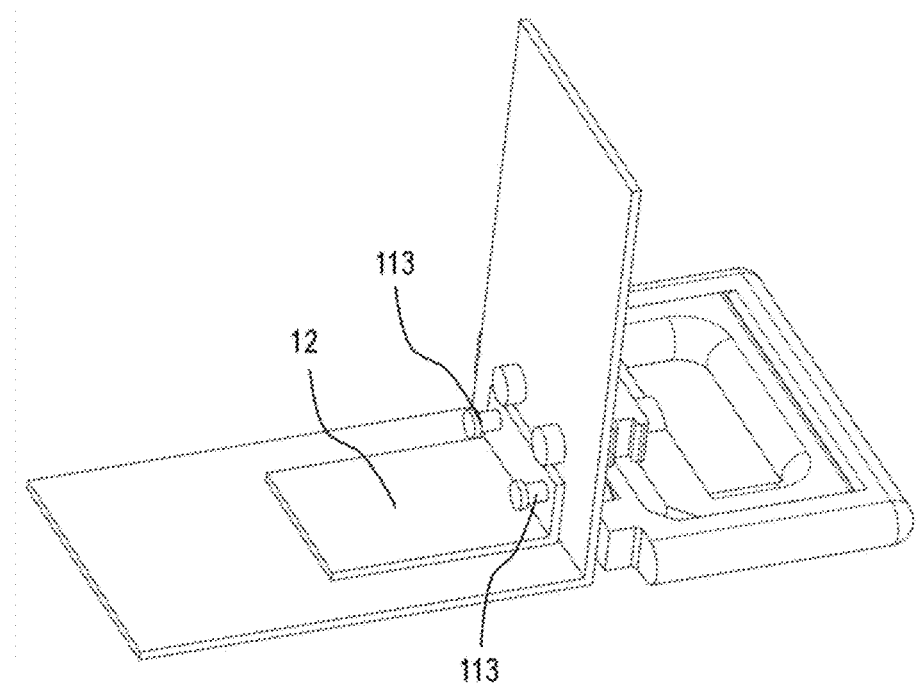

FIG. 1 shows a schematic view of the arrangement of the drawer assembly 100 according to some embodiments of the present disclosure. FIGS. 2 to 4 show a schematic view of the installation of a drawer 1 and a handle 2 according to some embodiments of the present disclosure. FIGS. 5 to 6 show a schematic view of the unlocking of the drawer 1 according to some embodiments of the present disclosure. As shown in FIGS. 1 to 6, the drawer assembly 100 described herein generally includes the drawers 1 and the handle 2, wherein the drawers 1 are arranged side by side, and the handle 2 can be detachably mounted on the drawers 1.

As shown in FIGS. 2 to 4, in some embodiments, the drawer 1 includes a housing 11, a connecting part 111 and a limiting groove 112, wherein the connecting part 111 and the limiting groove 112 are respectively disposed on the outer wall of the housing 11, and the size of one end of the connecting part 111 away from the housing 11 should be greater than the size of one end of the connecting part 111 adjacent to the housing 11.

Accordingly, the handle 2 includes a fixed gripping portion 21 and a limiting portion 22. A connecting groove 211 is disposed at one end of the fixed gripping portion 21 adjacent to the housing 11. A snap-on part 24 is disposed within the connecting groove 211, and the snap-on part 24 should be adjacent to the housing 11. The limiting portion 22 passes through the fixed gripping portion 21 and can move towards or away from the housing 11. Apparently, in a case that the handle 2 is mounted to the drawer 1, one end of the limiting portion 22 adjacent to the housing 11 moves to the inside of the limiting groove 112. Therefore, one end of the connecting part 111 adjacent to the housing 11 should further be fitted with the snap-on part 24, so that the connecting part 111 is limited within the connecting groove 211.

With the above configuration, the handle 2 is limited by the drawer 1 along the radial direction of the limiting groove 112 because one end of the limiting portion 22 adjacent to the housing 11 moves to the inside of the limiting groove 112; in addition, since one end of the connecting part 111 adjacent to the housing 11 is fitted with the snap-on part 24, and the connecting part 111 is limited in the connecting groove 211, the handle 2 is limited by the drawer 1 along the axial direction of the limiting groove 112. In summary, the handle 2 and the drawer 1 are firmly mounted in the axial and radial directions of the limiting groove 112, and since the handle 2 is detachably connected to the drawer 1, the volume of the handle 2 can be increased according to the usage requirements, which facilitates the operator to apply force and provides a good user experience.

Apparently, only with one handle, the drawer assembly 100 according to the embodiments of the present disclosure can complete the push-in and pull-out of all the drawers 1, without the need to mount the handle 2 on each drawer 1. Thereby, production costs can be significantly saved.

It is noteworthy that, in other embodiments, the limiting groove 112 may be replaced with a limiting hole, and one end of the housing 11 adjacent to the limiting portion 22 can further move to the inside of the limiting hole.

Referring to FIGS. 2 to 3, in some embodiments, the limiting portion 22 is used to be fitted with the limiting groove 112. The limiting portion 22 may includes a limiting rod 221 and a limiting part 222 and a base 223 disposed at both ends of the limiting rod 221. The limiting rod 221 may pass through the fixed gripping portion 21 so that the limiting portion 22 can move relative to the fixed gripping portion 21. The limiting part 222 is closer to the housing 11 of the drawer 1 relative to the base 223, and the limiting part 222 and the base 223 are located on both sides of the fixed gripping portion 21, respectively.

Figure 7:
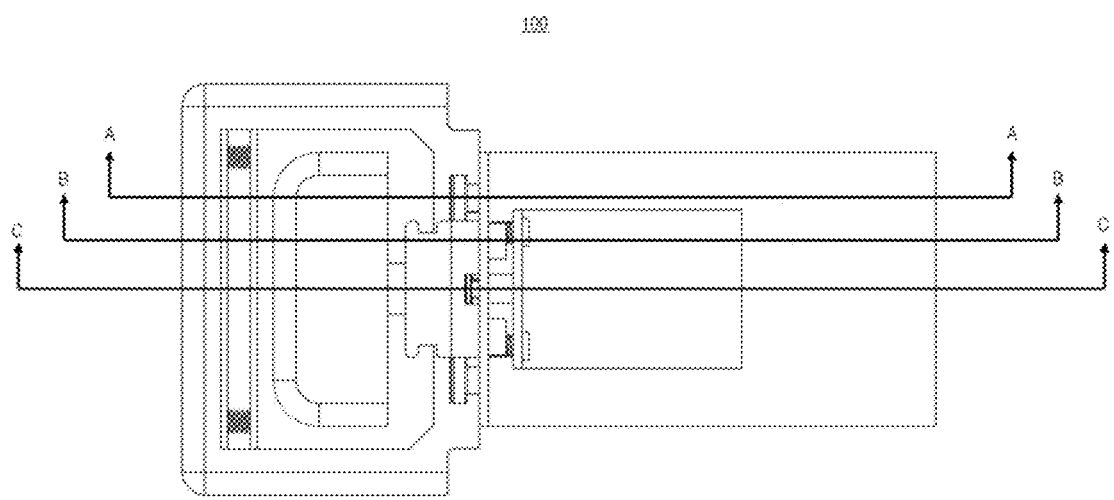
FIG. 7 shows a top view of a drawer assembly according to some embodiments of the present disclosure.
Figure 8:
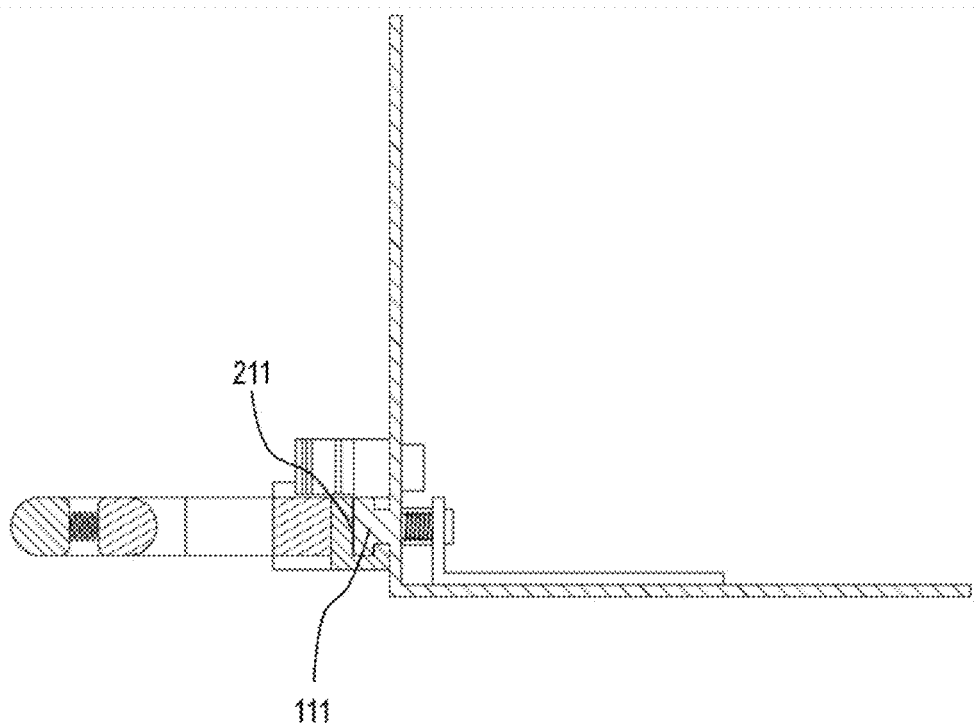
FIG. 8 shows a sectional view taken along A-A of the drawer assembly shown in FIG. 7.

FIG. 7 shows a top view of the drawer assembly 100 according to some embodiments of the present disclosure. FIG. 8 shows a sectional view taken along A-A of the drawer assembly 100 shown in FIG. 7. Apparently, during the installation of the handle 2 and the drawer 1, as shown in FIGS. 1 and 2, the handle 2 is in contact with the housing 11 of the drawer 1, and the limiting portion 22 is moved away from the housing 11 by the force of the housing 11. The limiting part 222 further moves away from the housing 11, and the fixed gripping portion 21 contacts and closely adheres to the housing 11 of the drawer 1. Still referring to FIGS. 2, 3, 7, and 8, the handle 2 is moved upward. In a case that the limiting part 222 is aligned with the limiting groove 112, the limiting part 222 moves adjacent to the housing 11 and causes the limiting part 222 to move to the inside of the limiting groove 112. At the same time, the connecting part 111 is limited in the connecting groove 211 by the snap-on part 24. At this point, the handle 2 and the drawer 1 are mounted.

Figure 9:
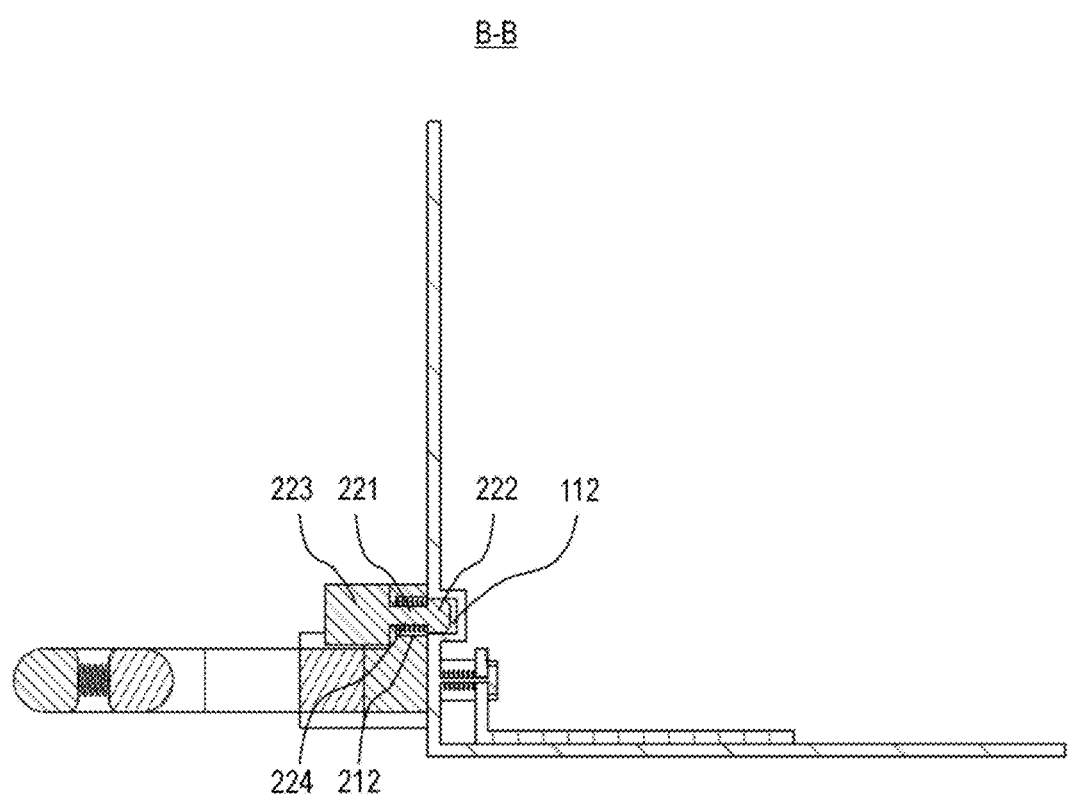
FIG. 9 shows a sectional view taken along B-B of the drawer assembly shown in FIG. 7.

FIG. 9 shows a sectional view taken along B-B of the drawer assembly 100 shown in FIG. 7. As shown in FIG. 9, in some embodiments, the limiting portion 22 may further includes a first elastic part 224 disposed around the outer surface of the limiting rod 221. A receiving groove 212 may be disposed at one end of the fixed gripping portion 21 adjacent to the housing 11. One end of the first elastic part 224 may contact the end face of the receiving groove 212 away from the housing 11, and the other end of the first elastic part 224 may contact the limiting part 222. In a case that the first elastic part 224 is released, the limiting part 222 may extend out of the receiving groove 212, and the limiting part 222 is located inside the limiting groove 112.

Apparently, in a case that the handle 2 is in contact with the housing 11 of the drawer 1, since the limiting part 222 will be moved away from the housing 11 by the force of the shell 11, the first elastic part 224 is compressed in the receiving groove 212. In a case that the limiting part 222 is aligned with the limiting groove 112, the compressed first elastic part 224 will release energy, causing the first elastic part 224 to drive the limiting part 222 to extend out of the receiving groove 212, and the first elastic part 224 can drive the limiting part 222 to move into the limiting groove 112, ultimately causing the handle 2 to be limited by the drawer 1 along the radial direction of the limiting groove 112.

Still referring to FIG. 4, if it is necessary to detach the handle 2 from the drawer 1, firstly the base 223 is pulled in the direction away from the housing 11, and the limiting rod 221 and the limiting part 222 further move in the direction away from the housing 11. The limiting part 222 is separated from the limiting groove 112. Then, the hand holding the base 223 does not move, and the hand holding the fixed gripping part 21 moves the handle 2 downward, so that the connecting part 111 is separated from the connecting groove 211. Since both hands need to operate simultaneously during the process of detaching the handle 2 from the drawer 1, misoperation is avoided.

Specifically, in order to ensure the safety performance of the drawer assembly 100, a locking part 12 is usually disposed inside the drawer 1, and the locking part 12 needs to be pulled for a distance before pulling the drawer 1, so that the locking part 12 can be unlocked. Accordingly, the handle 2 further includes a movable gripping portion 23, and the movable gripping portion 23 is wrapped inside the fixed gripping portion 21. Apparently, the movable gripping portion 23 can further move towards or away from the housing 11, and the movable gripping portion 23 needs to be connected to the locking part 12, so that the locking part 12 can be pulled through the movable gripping portion 23.

In some embodiments, the locking part 12 may pass through the housing 11, and the end of the locking part 12 passes through the housing 11 is connected to the movable gripping portion 23. In a case that the movable gripping portion 23 moves away from the housing 11, the movable gripping portion 23 can drive the locking part 12 to move and unlock the locking part 12, thereby completing the subsequent operation of pulling out the drawer 1.

Still referring to FIGS. 2 to 4, a moving groove 213 is further disposed at the end of the fixed gripping portion 21 adjacent to the housing 11, which needs to extend to the movable gripping portion 23. The end of the locking part 12 passing through the housing 11 can be moved in the moving groove 213 so that the end of the locking part 12 passing through the housing 11 is connected to the movable gripping portion 23 through the moving groove 213. Of course, a structure that is fitted with the end of the locking part 12 passing through the housing 11 should be disposed on the movable gripping portion 23, so that the movable gripping portion 23 is firmly connected to the locking part 12.

Figure 10:
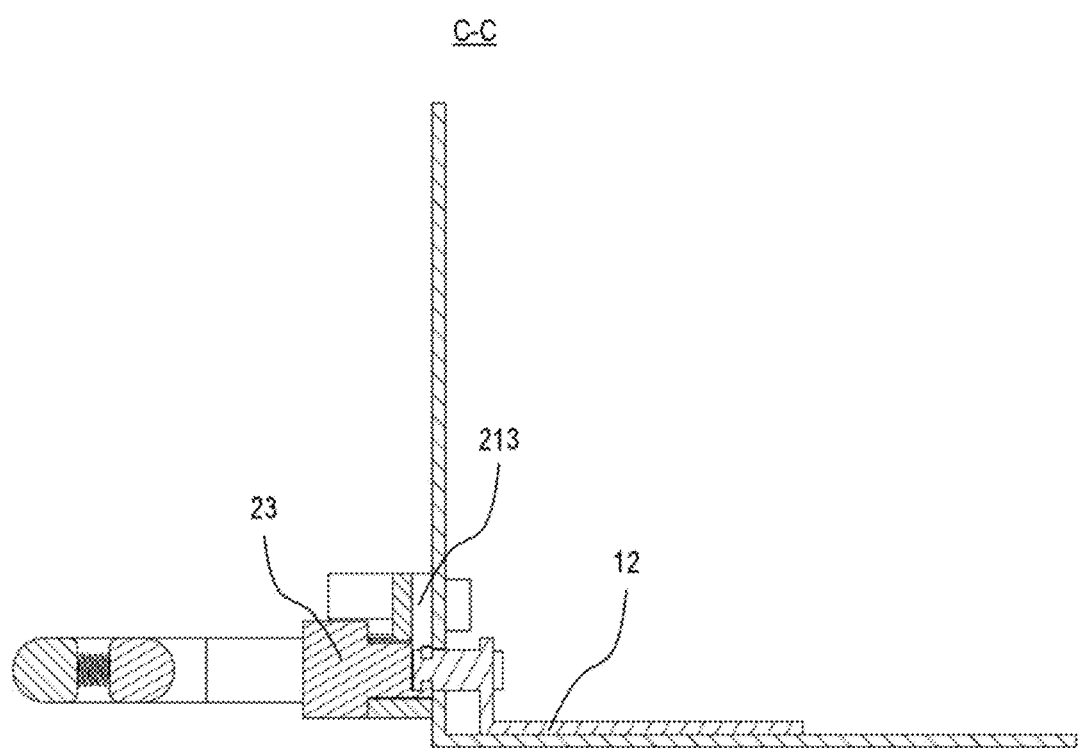
FIG. 10 shows a sectional view taken along C-C of the drawer assembly shown in FIG. 7.

Apparently, since the movable gripping portion 23 is wrapped inside the fixed gripping portion 21, and during the process of mounting the handle 2 and the drawer 1, the handle 2 needs to move upward; as shown in FIG. 2, a moving groove 213 needs to be disposed at the end of the fixed gripping portion 21 adjacent to the housing 11. FIG. 10 shows a sectional view taken along C-C of the drawer assembly 100 shown in FIG. 7. As shown in FIG. 10, the end of the locking part 12 passing through the shell 11 moves along the moving groove 213 and is connected to the movable gripping portion 23.

In summary, in a case that the fixed gripping portion 21 remains stationary, only by pulling the movable gripping portion 23 in the direction away from the housing 11 and synchronously driving the locking part 12 to move, the unlocking operation of the locking part 12 can be completed. Then, by maintaining the relative positions of the fixed gripping portion 21 and the movable gripping portion 23 and synchronously pulling the fixed gripping portion 21 and the movable gripping portion 23, the drawer 1 can be pulled out. Similarly, if the drawer 1 needs to be pushed in, the fixed gripping portion 21 and the movable gripping portion 23 are kept in the relative positions when pulling out the drawer 1, and meanwhile the fixed gripping portion 21 and the movable gripping portion 23 are pushed in, so that the drawer 1 moves to a position that can be locked. Then, the movable gripping portion 23 is caused to move towards the housing 11, so that the movable gripping portion 23 drives the locking part 12 to move. In a case that the locking part 12 moves to the locked position, the drawer 1 can be locked.

Referring back to FIGS. 5 to 6, in some embodiments, in order to ensure the movement path of the locking part 12, a mounting part 113 is disposed on the inner wall of the housing 11. The locking part 12 may be disposed on the outer surface of the mounting part 113 so that the locking part 12 can move along the mounting part 113.

Still referring to FIGS. 5 to 6, further, a third elastic part 114 is disposed on the outer surface of the mounting part 113. One end of the third elastic part 114 is in contact with the inner wall of the housing 11, and the other end of the third elastic part 114 is in contact with the locking part 12. Apparently, in a case that the locking part 12 is in the locked position, that is, in a case that the movable gripping portion 23 is not pulled away from the housing 11, the third elastic part 114 is not compressed. However, in a case that the movable gripping portion 23 is pulled away from the housing 11, the locking part 12 is unlocked, and the third elastic part 114 is compressed. Therefore, when the drawer 1 needs to be locked, there is no need to manually push the movable gripping portion 23 to drive the locking part 12 to move, and the locking part 12 can be moved by the force released by the third elastic part 114.

In some embodiments, the end of the movable gripping portion 23 away from the housing 11 is spaced apart from the end of the fixed gripping portion 21 away from the housing 11. A second elastic part 231 is disposed at the end of the movable gripping portion 23 away from the housing 11, and the other end of the second elastic part 231 is connected to the end of the fixed gripping portion 21 away from the housing 11. Apparently, in a case that the movable gripping portion 23 is pulled away from the housing 11 to unlock the locking part 12, since the fixed gripping portion 21 does not move, the second elastic part 231 is compressed and stores energy. As shown in FIG. 3, the energy stored in the second elastic part 231 can move the movable gripping portion 23 towards the housing 11 and move the movable gripping portion 23 to the right position.

It is noteworthy that the connecting parts 111 and the limiting grooves 112 are provided in pairs, respectively, and accordingly, the connecting grooves 211, the snap-on parts 24, and the limiting portions 22 are further provided in pairs. As shown in FIG. 2, in some embodiments, the paired limiting grooves 112 may be located between the paired connecting parts 111, and the height of the paired limiting grooves 112 may be higher than the height of the paired connecting parts 111.

It is noteworthy that the figures, values, numbers and the like mentioned above and elsewhere in the present disclosure are exemplary and are not intended to limit the scope of the present disclosure in any way. Any other suitable figures, values, and numbers are possible. For example, depending on the specific application scenario and needs, a larger or less number of the connecting parts 111 or the limiting grooves 112 may be provided.

The handle 2 according to the embodiments of the present disclosure can be applied to various drawers 1, such as drawers 1 in electrical cabinets, to solve the problem of drawer 1 being too small to exert force. It should be understood that the handle 2 according to the embodiments of the present disclosure can further be applied to other components, and the 5 embodiments of the present disclosure are not intended to limit in this regard.

The above has described various embodiments of the present disclosure. The above description is exemplary, not exhaustive, and is not limited to the disclosed embodiments. Without departing from the scope and spirit of the described embodiments, many modifications and changes will be apparent to those of ordinary skill in the field. The choice of terms used herein is intended to best explain the principles, practical applications, or technical improvements in the market of each embodiment, or to enable other ordinary technicians in the field to understand the various embodiments disclosed herein.

What is claimed is:

1. A drawer assembly, comprising:
a drawer comprising a housing and a connecting part and a limiting groove disposed on an outer wall of the housing, the size of an end of the connecting part away from the housing being greater than the size of an end of the connecting part adjacent to the housing; and
a handle detachably connected to the drawer, the handle comprising a fixed gripping portion and a limiting portion, a connecting groove being disposed at an end of the fixed gripping portion adjacent to the housing, a snap-on part being disposed within the connecting groove, the limiting portion passing through the fixed gripping portion and being movable towards or away from the housing, wherein in a case that an end of the limiting portion adjacent to the housing moves to the inside of the limiting groove, an end of the connecting part adjacent to the housing is fitted with the snap-on part, so that the connecting part is limited within the connecting groove.

2. The drawer assembly of claim 1, wherein the limiting portion comprises a limiting rod passing through the fixed gripping portion and a limiting part and a base disposed at both ends of the limiting rod, the limiting part is adjacent to the housing and fitted with the limiting groove.

3. The drawer assembly of claim 2, wherein the limiting portion further comprises a first elastic part disposed around an outer surface of the limiting rod, a receiving groove is disposed at an end of the fixed gripping portion adjacent to the housing, one end of the first elastic part is in contact with an end face of the receiving groove away from the housing, the other end of the first elastic part is in contact with the limiting part, and in a case that the first elastic part is released, the limiting part extends out of the receiving groove.

4. The drawer assembly of claim 1, wherein the handle further comprises a movable gripping portion wrapped by the fixed gripping portion, the movable gripping portion is movable towards or away from the housing, a locking part is further disposed inside the drawer, the locking part passes through the housing and an end of the locking part passing through the housing is connected to the movable gripping portion, wherein in a case that the movable gripping portion moves away from the housing, the movable gripping portion drives the locking part to move and unlocks the locking part.

5. The drawer assembly of claim 4, wherein an end of the movable gripping portion away from the housing is spaced apart from an end of the fixed gripping portion away from the housing, and a second elastic part is disposed at an end of the movable gripping portion away from the housing, and the other end of the second elastic part is connected to an end of the fixed gripping portion away from the housing.

6. The drawer assembly of claim 4, wherein a moving groove is further disposed at an end of the fixed gripping portion adjacent to the housing, and an end of the locking part passing through the housing is movable within the moving groove to be connected to the movable gripping portion.

7. The drawer assembly of claim 5, wherein the drawer further comprises a mounting part disposed on an inner wall of the housing, the locking part is disposed on an outer surface of the mounting part and movable along the mounting part.

8. The drawer assembly of claim 7, wherein a third elastic part disposed on an outer surface of the mounting part, an end of the third elastic part is in contact with the inner wall of the housing, and the other end of the third elastic part is in contact with the locking part.

* * * * *